(12) United States Patent
Korber

(10) Patent No.: US 7,670,907 B2
(45) Date of Patent: Mar. 2, 2010

(54) ISOLATION REGIONS FOR SEMICONDUCTOR DEVICES AND THEIR FORMATION

(75) Inventor: Mark S. Korber, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 157 days.

(21) Appl. No.: 12/050,284

(22) Filed: Mar. 18, 2008

(65) Prior Publication Data

US 2008/0166843 A1 Jul. 10, 2008

Related U.S. Application Data

(62) Division of application No. 11/043,838, filed on Jan. 26, 2005, now Pat. No. 7,344,942.

(51) Int. Cl.
H01L 21/336 (2006.01)
H01L 21/76 (2006.01)
H01L 21/311 (2006.01)

(52) U.S. Cl. .............. 438/257; 438/424; 438/694; 438/702

(58) Field of Classification Search ........ 438/257, 438/637, 435, 424, 638, 639, 640, 668, 425, 438/426, 702, 180, 911
See application file for complete search history.

(56) References Cited

U.S. PATENT DOCUMENTS

| | | | | |
|---|---|---|---|---|
| 5,998,301 A | * | 12/1999 | Pham et al. | 438/701 |
| 6,103,574 A | * | 8/2000 | Iwasaki | 438/257 |
| 6,235,581 B1 | * | 5/2001 | Chen | 438/257 |
| 6,238,976 B1 | * | 5/2001 | Noble et al. | 438/259 |
| 6,596,608 B2 | | 7/2003 | Saito | |
| 6,624,022 B1 | | 9/2003 | Hurley et al. | |
| 6,849,518 B2 | | 2/2005 | Parat et al. | |
| 2002/0038884 A1 | * | 4/2002 | Shirota et al. | 257/314 |
| 2002/0045303 A1 | * | 4/2002 | Lee | 438/201 |
| 2004/0092115 A1 | | 5/2004 | Hsieh et al. | |

* cited by examiner

*Primary Examiner*—Chuong A. Luu
(74) *Attorney, Agent, or Firm*—Leffert Jay & Polglaze, P.A.

(57) ABSTRACT

A hard mask layer is formed and patterned overlying a semiconductor substrate of a semiconductor device. The patterned hard mask layer exposes two or more areas of the substrate for future isolation regions of the semiconductor device. Portions of the substrate are removed in the areas for future isolation regions, thereby forming two or more trenches. A second mask layer is formed overlying a first portion of the hard mask layer and at least one first trench, and a second portion of the hard mask layer and at least one second trench are left uncovered. Additional substrate material is removed from the at least one second trench so that the at least one second trench is deeper than the at least one first trench. The hard mask layer and the second mask are removed substantially concurrently.

27 Claims, 7 Drawing Sheets

ISOLATION REGIONS FOR SEMICONDUCTOR DEVICES AND THEIR FORMATION

RELATED APPLICATION

This application is a divisional of U.S. application Ser. No. 11/043,838, titled "ISOLATION REGIONS FOR SEMICONDUCTOR DEVICES AND THEIR FORMATION," filed Jan. 26, 2005 now U.S. Pat. No. 7,344,942, which application is commonly assigned and incorporated herein by reference.

TECHNICAL FIELD OF THE INVENTION

The present invention relates generally to semiconductor devices and in particular the present invention relates to isolation regions for semiconductor devices and their formation.

BACKGROUND OF THE INVENTION

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

Memory devices are typically formed on semiconductor substrates using semiconductor fabrication methods. The array of memory cells is disposed on the substrate. Isolation regions formed in the substrate within the array, e.g., shallow trench isolation, provide voltage isolation on the memory array by acting to prevent extraneous current flow through the substrate between the memory cells. High-voltage circuitry, such as for accessing, programming, and erasing the memory cells, e.g., select circuitry having high voltage pumps, etc., is also disposed on the substrate at a periphery of the memory array. Isolation regions formed in the substrate at the periphery provide high-voltage isolation at the periphery by acting to prevent extraneous current from flowing through the substrate between the high-voltage circuitry and the memory array.

The isolation regions are often formed within the array and the periphery concurrently. One problem with this is that the periphery and array trenches that contain the isolation material, e.g., dielectric material, tend to have substantially the same depth that is limited by the depth of the array trenches because the aspect ratio (trench depth to trench width w) of the array trenches is larger than that of the periphery trenches because of the relatively small spacing between memory cells, especially for arrays having high-densities of memory cells. Trenches with higher aspect ratios become more difficult to fill. However, this trench depth for the periphery trenches is often insufficient for preventing extraneous current flow through the substrate between the high-voltage circuitry at the periphery and the memory array. Alternatively, the periphery trenches, with their larger widths, are often made deeper than the array trenches. However, this often results in extra and often more complex fabrication steps.

For the reasons stated above, and for other reasons stated below which will become apparent to those skilled in the art upon reading and understanding the present specification, there is a need in the art for alternative methods for forming isolation regions of memory devices.

DETAILED DESCRIPTION

Figure 1:
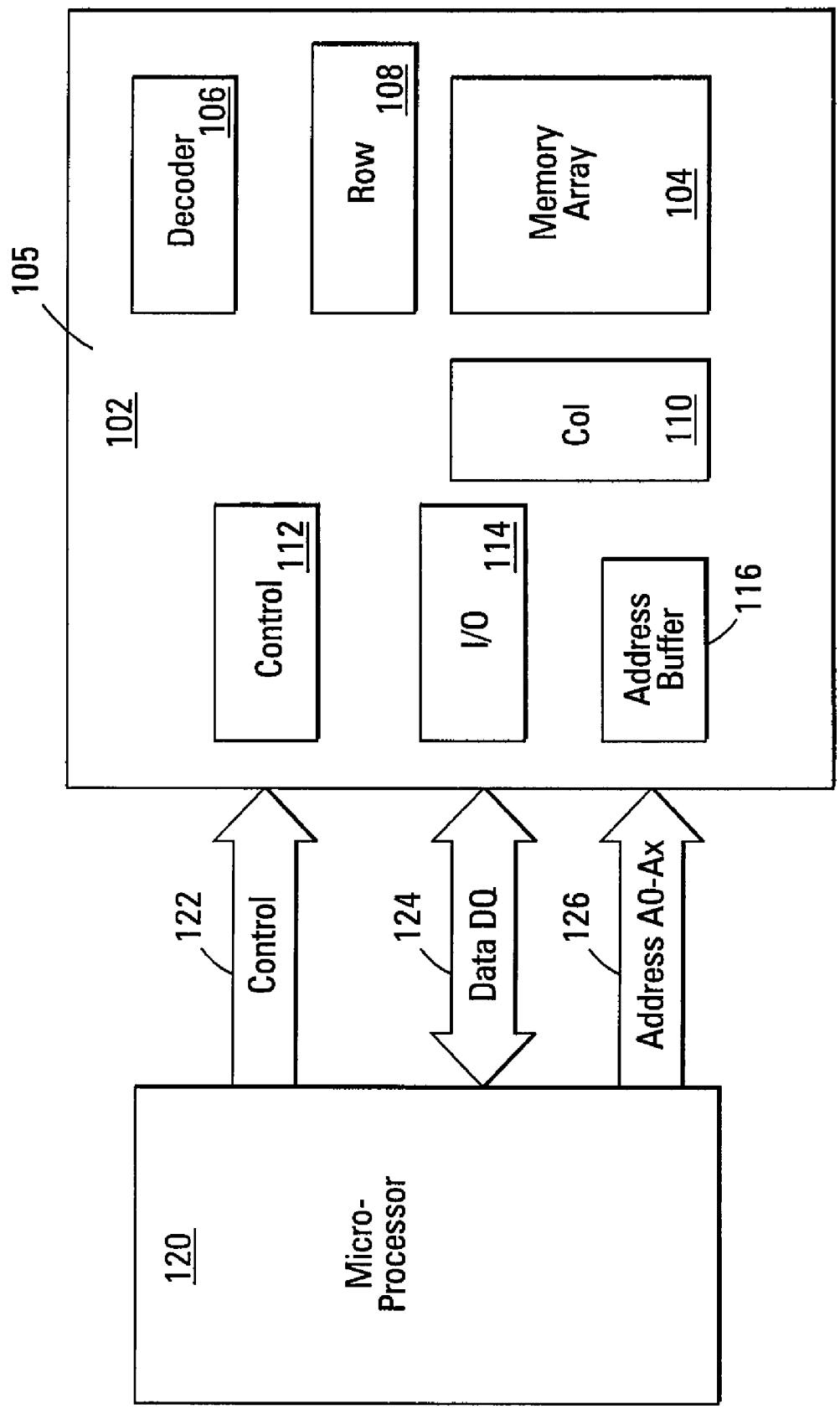
FIG. 1 is a block diagram illustration of an integrated circuit device, according to an embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The term wafer or substrate used in the following description includes any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

FIG. 1 is a block diagram illustration of an integrated circuit device, such as a processor, a memory device 102, etc., according to an embodiment of the invention. The memory device 102 may be fabricated as semiconductor device on a semiconductor substrate. Examples of memory devices include NAND or NOR flash memory devices, dynamic random access memory devices (DRAMs), static random access memory devices (SRAMs), or the like.

For one embodiment, memory device 102 includes an array of flash memory cells 104 and a region 105 peripheral to memory array 104 that includes an address decoder 106, row access circuitry 108, column access circuitry 110, control circuitry 112, Input/Output (I/O) circuitry 114, and an address buffer 116. The row access circuitry 108 and column access circuitry 110 may include high-voltage circuitry, such as high-voltage pumps. The device of FIG. 1 includes isolation regions formed in accordance with an embodiment of the invention, e.g., between region 105 and memory 104 as well as within memory array 104.

Memory device 100 may be coupled an external microprocessor 120, or memory controller, for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention.

The memory array 104 includes memory cells arranged in row and column fashion. For one embodiment, each of the memory cells includes a floating-gate field-effect transistor capable of holding a charge. The cells may be grouped into blocks. Each of the cells within a block can be electrically programmed on an individual basis by charging the floating gate. The charge can be removed from the floating gate by a block erase operation.

Figure 2:
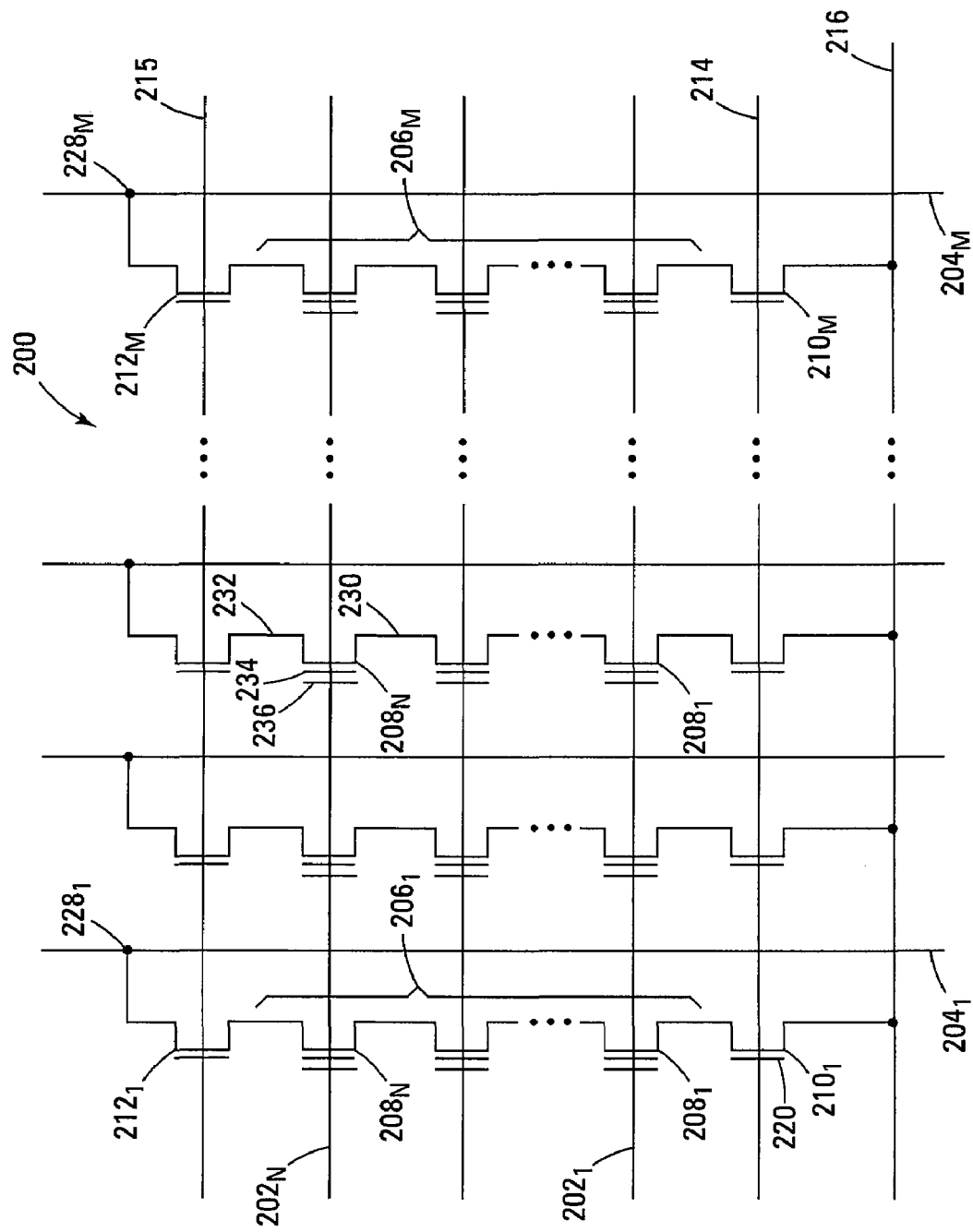
FIG. 2 is a schematic of a NAND memory array in accordance with an embodiment of the invention.

FIG. 2 is a schematic of a NAND memory array 200 as a portion of memory array 104 of FIG. 1 in accordance with another embodiment of the invention. As shown in FIG. 2, the memory array 200 includes word lines 202, to $202_N$ and intersecting local bit lines 204, to $204_M$. For ease of addressing in the digital environment, the number of word lines 202 and the number of bit lines 204 are each some power of two, e.g., 256 word lines 202 by 4,096 bit lines 204. The local bit lines 204 are coupled to global bit lines (not shown) in a many-to-one relationship.

Memory array 200 includes NAND strings $206_1$ to $206_M$. Each NAND string includes floating-gate transistors $208_1$ to $208_N$, each located at an intersection of a word line 202 and a local bit line 204. The floating-gate transistors 208 represent non-volatile memory cells for storage of data. The floating-gate transistors 208 of each NAND string 206 are connected in series, source to drain, between a source select gate 210, e.g., a field-effect transistor (FET), and a drain select gate 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate 220 of each source select gate 210 is connected to source select line 214.

The drain of each drain select gate 212 is connected to a local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202. Memory array 200 includes isolation regions formed in accordance with an embodiment of the invention, e.g., between rows or columns of memory array 200.

Figure 3:
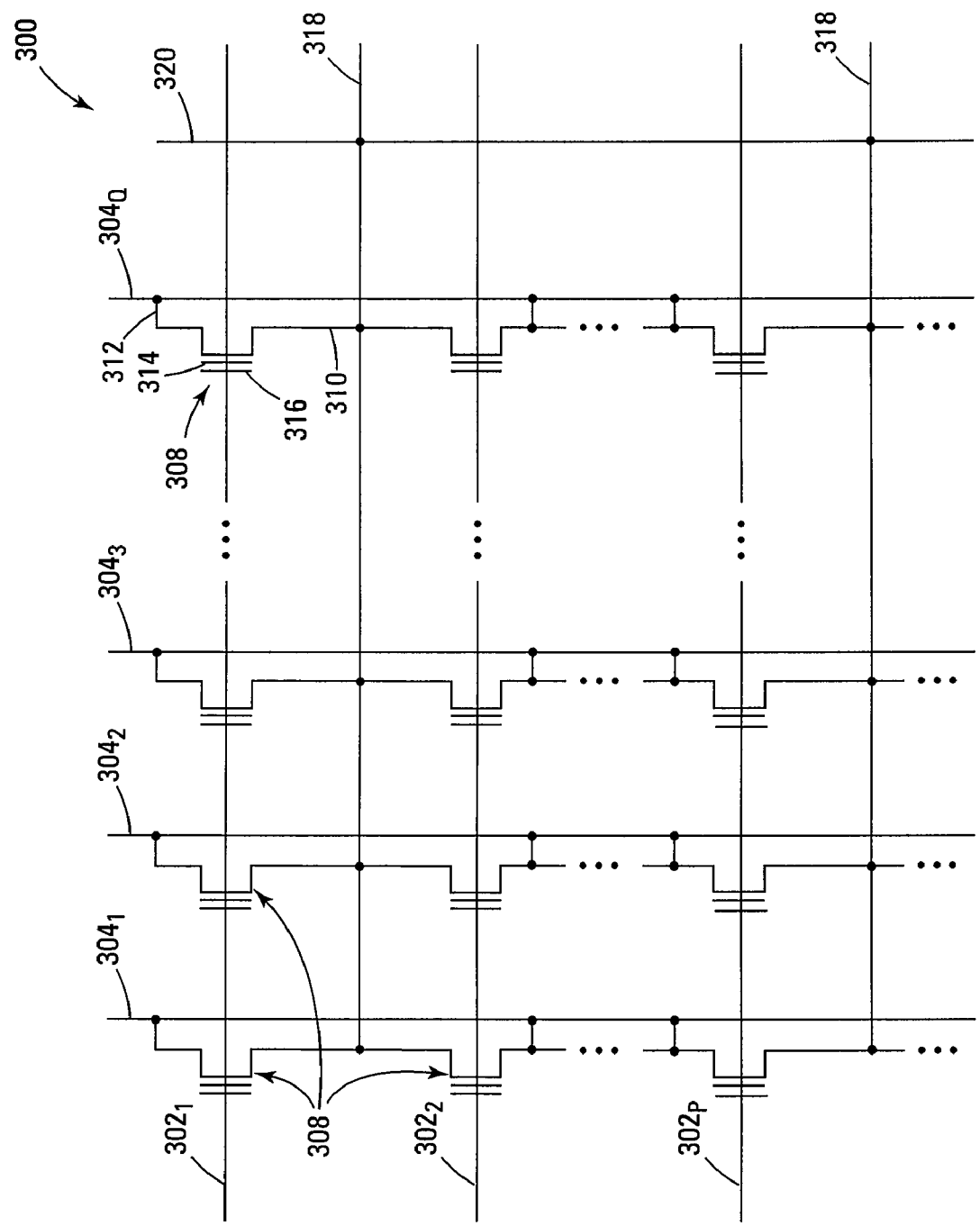
FIG. 3 is a schematic of a NOR memory array in accordance with an embodiment of the invention.

FIG. 3 is a schematic of a NOR memory array 300 as a portion of memory array 104 of FIG. 1 in accordance with another embodiment of the invention. Memory array 300 includes word lines $302_1$ to $302_P$ and intersecting local bit lines $304_1$ to $304_Q$. For ease of addressing in the digital environment, the number of word lines 302 and the number of bit lines 304 are each some power of two, e.g., 256 word lines 302 by 4,096 bit lines 304. The local bit lines 304 are coupled to global bit lines (not shown) in a many-to-one relationship.

Floating-gate transistors 308 are located at each intersection of a word line 302 and a local bit line 304. The floating-gate transistors 308 represent non-volatile memory cells for storage of data. Typical construction of such floating-gate transistors 308 includes a source 310 and a drain 312, a floating gate 314, and a control gate 316.

Floating-gate transistors 308 having their control gates 316 coupled to a word line 302 typically share a common source depicted as array source 318. As shown in FIG. 3, floating-gate transistors 308 coupled to two adjacent word lines 302 may share the same array source 318. Floating-gate transistors 308 have their drains 312 coupled to a local bit line 304. A column of the floating-gate transistors 308 includes those transistors commonly coupled to a given local bit line 304. A row of the floating-gate transistors 308 includes those transistors commonly coupled to a given word line 302. Memory array 300 includes isolation regions formed in accordance with an embodiment of the invention, e.g., between rows or columns of memory array 300.

To reduce problems associated with high resistance levels in the array source 318, the array source 318 is regularly coupled to a metal or other highly conductive line to provide a low-resistance path to ground. The array ground 320 serves as this low-resistance path.

Figure 4A:
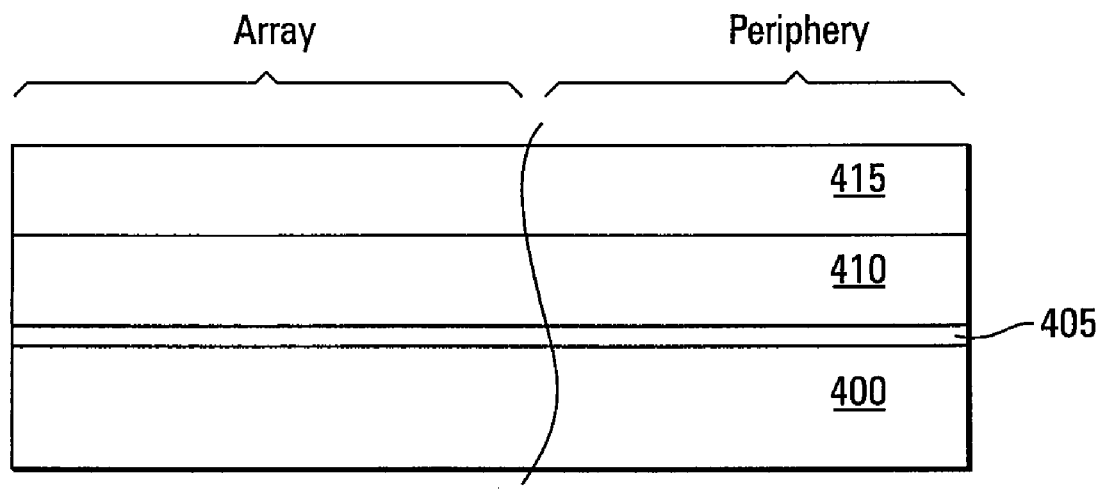
FIGS. 4A-4G are cross-sectional views of a portion of an integrated circuit device at various stages of fabrication in accordance with one embodiment of the invention.

FIGS. 4A-4G generally depict a method of forming a portion of a memory device, such as memory device 102 of FIG. 1, in accordance with one embodiment of the invention. FIG. 4A depicts a portion of the memory device after several processing steps have occurred. The structure of FIG. 4A includes an array portion where an array of memory cells, such as memory array 104 of memory device 102, will be formed. The structure of FIG. 4A further includes a portion peripheral to the memory array, such as the region 105 of memory device 102, where logic devices, e.g., of row access circuitry 108 and column access circuitry 110 of memory 102 of FIG. 1, will be formed. For one embodiment, the logic devices include field-effect transistors.

Formation of the type of structure depicted in FIG. 4A is well known and will not be detailed herein. In general, FIG.

4A depicts a silicon-containing substrate 400 upon which a first dielectric layer 405, a first conductive layer 410, and a protective cap layer 415 have been formed. For one embodiment, the substrate 400 is a monocrystalline silicon substrate. For a further embodiment, substrate 400 is a P-type monocrystalline silicon substrate. The first dielectric layer 405, for one embodiment, is an oxide layer that can be blanket deposited or thermally grown on substrate 400. For another embodiment, first conductive layer 410 is a silicon-containing layer, preferably a polysilicon (polycrystalline silicon) layer, but could also include other forms of doped or undoped silicon materials, such as monocrystalline silicon, nanocrystalline silicon, and amorphous silicon. For one embodiment, protective cap layer 415 may be a nitride layer, e.g., a silicon nitride ($Si_3N_4$) layer, that is blanket deposited on first conductive layer 410. For the embodiment depicted in FIGS. 4A-4G, first dielectric layer 405 of the memory array portion will form a tunnel dielectric layer of one or more memory cells, and first conductive layer 410 of the memory array portion will form a floating gate layer of the one or more memory cells. Protective cap layer 415 is a sacrificial layer in this example. For another embodiment, first conductive layer 410 is omitted at this point in the fabrication process, and protective cap layer 415 is formed directly on first dielectric layer 405. For this embodiment, protective cap layer 415 and the first dielectric layer 405 are both sacrificial layers. It will be clear that other additional or alternate materials may be used depending upon what is desired to be formed on the active areas between the isolation regions.

Figure 4B:
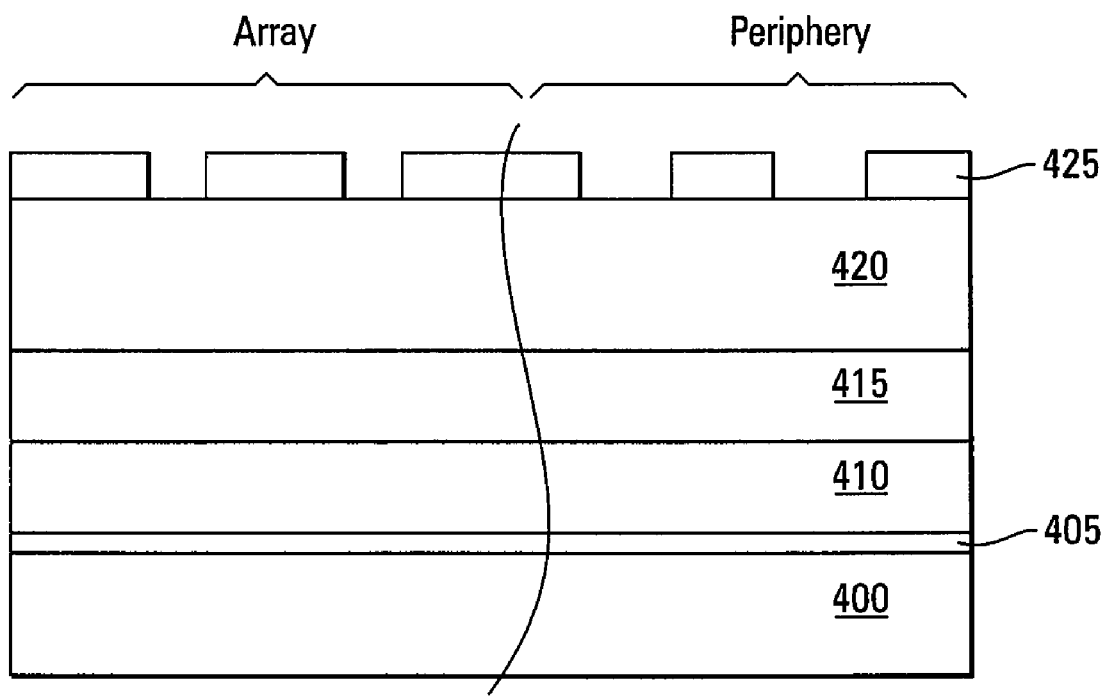
Figure 4C:
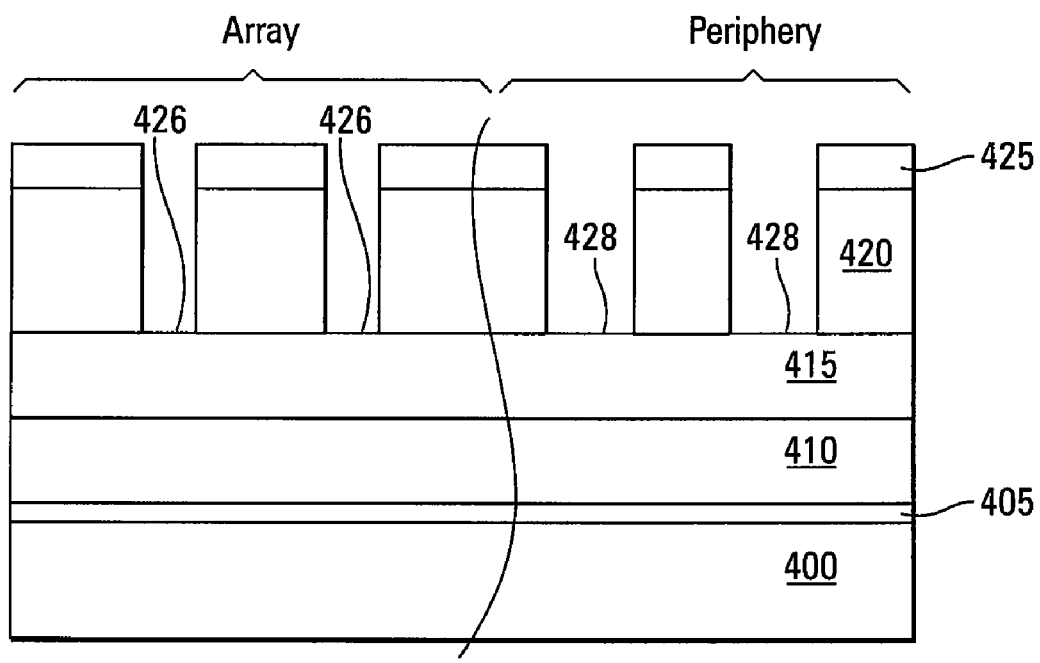

In FIG. 4B, a hard mask layer 420 is formed overlying protective cap layer 415. For one embodiment, a patterned photoresist mask layer 425 is also formed on hard mask layer 420 in FIG. 4B to define areas for removal. Specifically, mask layer 425 is patterned to include regions for exposing portions of hard mask layer 420. The exposed areas of hard mask layer 420 are then removed in FIG. 4C, e.g., using a dry etch, in FIG. 4C, to respectively expose portions 426 of protective cap layer 415 of the memory array portion and portions 428 of protective cap layer 415 of the periphery.

Figure 4D:
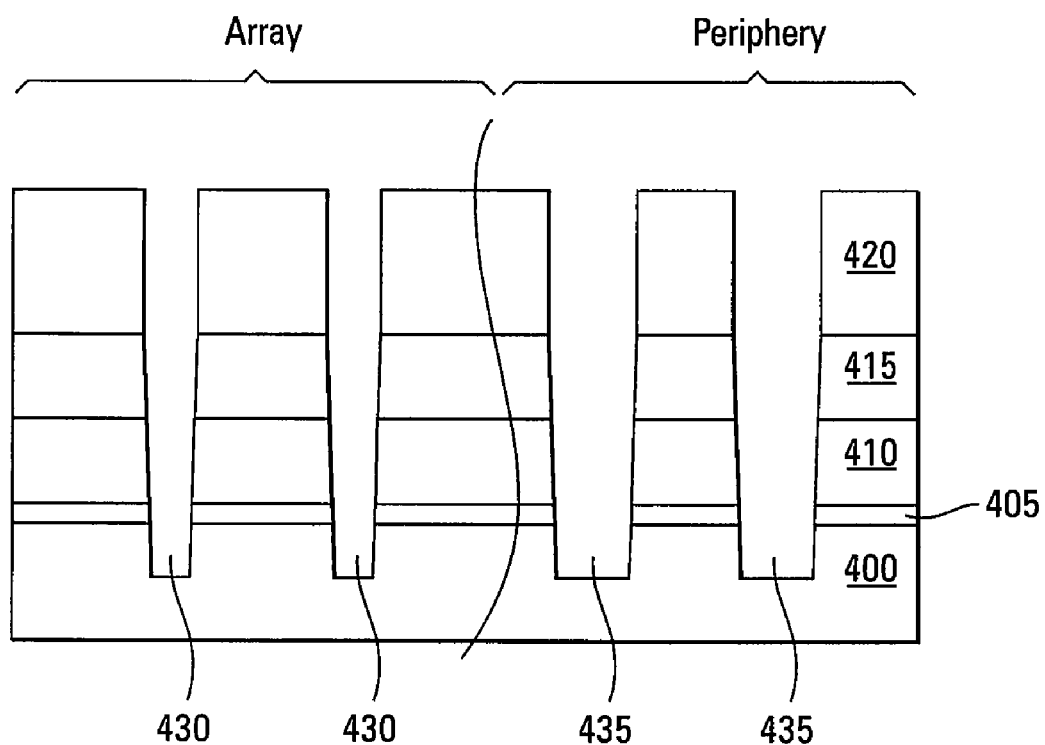

Mask layer 425 is removed in FIG. 4D. The exposed portions 426 and 428 of protective cap layer 415 are also removed in FIG. 4D to respectively form trenches 430 in the memory array portion and trenches 435 in the periphery. Trenches 430 and 435 pass through protective cap layer 415, first conductive layer 410, and first dielectric layer 405 or protective cap layer 415 and first dielectric layer 405 and extend to substantially the same depth within substrate 400. This defines active regions underlying the first dielectric layer 405 in the memory array and the periphery.

Figure 4E:
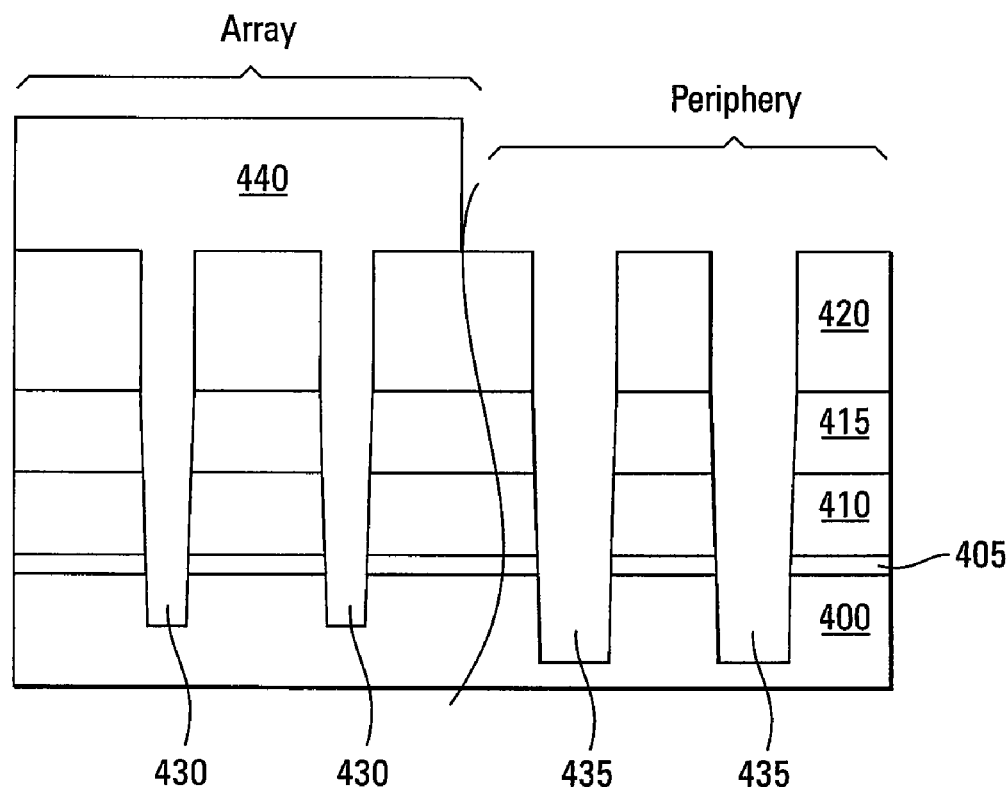

A mask layer 440, e.g., a photoresist mask layer, is formed overlying the memory array portion in FIG. 4E, but not overlying the periphery. Note that mask layer 440 is patterned without an additional mask layer, whereas for hard mask layer 420 requires a separate mask, e.g., mask layer 425, to pattern it. Additional substrate material is then removed from trenches 435 in the periphery to increase their extent (or depth) in substrate 400, e.g., by etching. Hard mask layer 420 acts to protect protective cap layer 415, first conductive layer 410, first dielectric layer 405, and the portion of silicon-containing substrate 400 underlying hard mask layer 420 during this etch. Therefore, there is no need to pattern the periphery for etching trenches 435 to a greater depth than trenches 430.

Figure 4F:
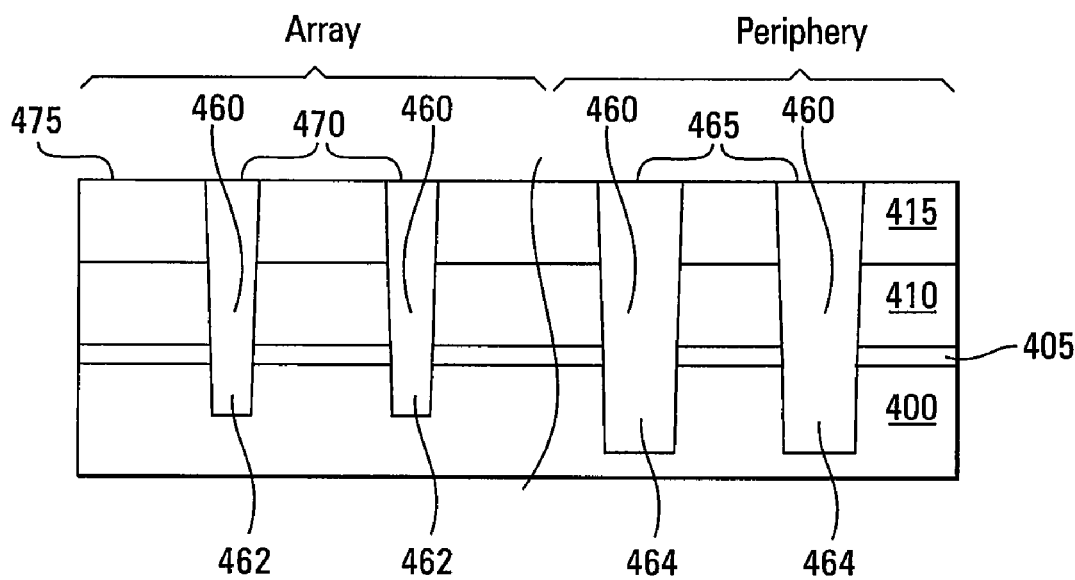

In FIG. 4F, a stripping operation, e.g., a standard photo-processing strip, is performed for removing mask layer 440 and hard mask layer 420 substantially concurrently. For one embodiment, hard mask layer 420 is a carbon layer or any other layer that can be removed substantially concurrently with mask layer 440. For another embodiment, the standard photo-processing strip includes ashing mask layer 440 and hard mask layer 420 using a plasma strip followed by an application of sulfuric acid mixed with hydrogen peroxide for removing any residual mask layer 440 and hard mask layer 420 materials, ash, etc. The stripping operation needs to be performed to remove mask layer 440 regardless. Therefore, using the same stripping operation to remove hard mask layer 420 substantially concurrently with removing mask layer 440 means that no additional processing is required to make trenches 435 of the periphery deeper than trenches 430 of the memory array portion. Such concurrent processing is made possible by selecting the materials of hard mask layer 420 and mask layer 440 to have similar selectivity to a removal process.

After removing mask layer 440 and hard mask layer 420, a layer of dielectric material 460 is deposited in the trenches 430 and 435 and overlying protective cap layer 415, such as by blanket deposition or a spin-on process. Suitable dielectric materials may include oxides, e.g., thermal oxides and/or high-density-plasma (HDP) oxides, spin-on dielectric materials, e.g., hydrogen silsesquioxane (HSQ), hexamethyldisiloxane, octamethyltrisiloxane, etc.

Subsequently, a portion of the dielectric material 460 is removed, e.g., by chemical mechanical planerization (CMP), leaving trenches 430 and 435 filled with the dielectric material 460 and upper surfaces 465 of the dielectric material 460 within each of trenches 435 and upper surfaces 470 of the dielectric material 460 within each of trenches 430 substantially flush with an upper surface 475 of protective cap layer 415. The trenches 430 and 435 filled with the dielectric material 460 respectively form isolation regions 462 in the memory array portion and isolation regions 464 in the periphery. Isolation regions 462 define active regions therebetween in the memory array over which memory cells will be formed. Isolation regions 464 define active regions therebetween in the periphery over which logic devices will be formed.

Figure 4G:
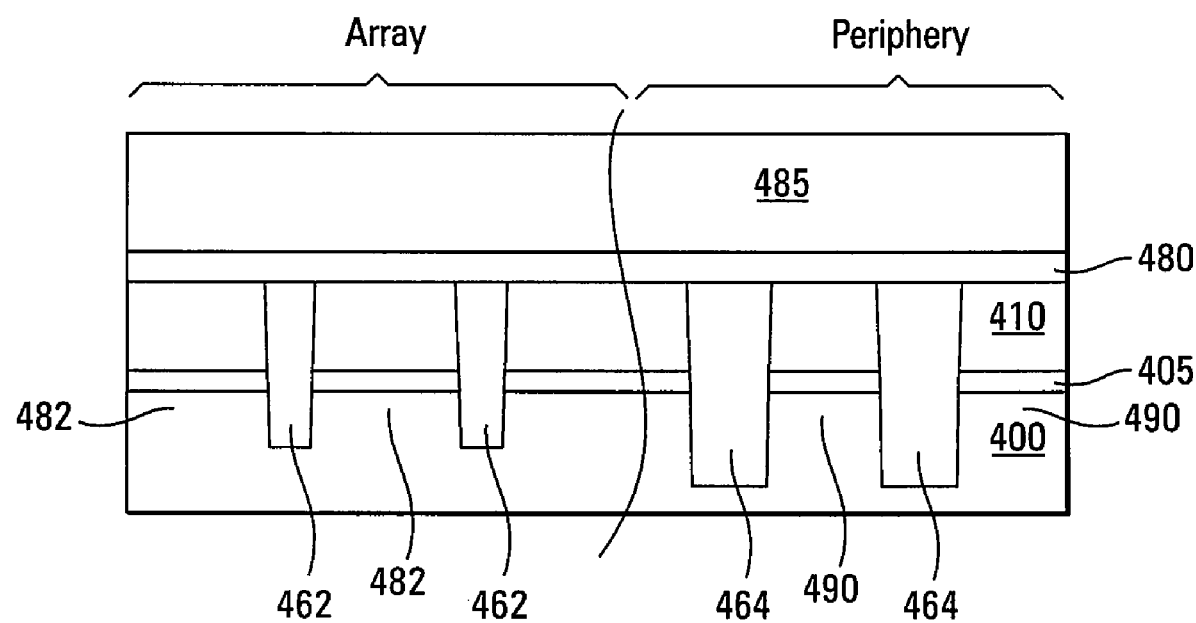

In FIG. 4G, protective cap layer 415 is removed and a second dielectric layer 480 is formed overlying first conductive layer 410 and the isolation regions 462 and 464. The second dielectric layer 480 may be one or more layers of dielectric material. For example, the second dielectric layer 480 could be of a multi-layer dielectric material commonly referred to as ONO (oxide-nitride-oxide). Other dielectric materials may be substituted for the ONO, such as tantalum oxide, barium strontium titanate, silicon nitride, and other materials providing dielectric properties.

A second conductive layer 485 is formed overlying the second dielectric layer 480. The second conductive layer 485 is generally one or more layers of conductive material. For one embodiment, the second conductive layer 485 contains a conductively-doped polysilicon. For a further embodiment, the second conductive layer 485 includes a metal-containing layer overlying a polysilicon layer, e.g., a refractory metal silicide layer formed on a conductively-doped polysilicon layer. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals. For another embodiment, second conductive layer 485 contains multiple metal-containing layers, e.g., a titanium nitride (TiN) barrier layer overlying the second dielectric layer 480, a titanium (Ti) adhesion layer overlying the barrier layer, and a tungsten (W) layer overlying the adhesion layer. An insulative cap layer (not shown) is often formed overlying the second conductive layer 485 to protect and isolate the second conductive layer 485 from further processing.

The first conductive layer 410, the second dielectric layer 480, and the second conductive layer 485 form gate stacks. In the array portion of the memory device, the gate stacks form a part of floating gate memory cells 482, where the first dielectric layer 405 is a tunnel dielectric layer, the first conductive layer 410 is a floating gate, the second dielectric layer 480 is an intergate dielectric layer, and the second conductive layer 485 is a control gate of the memory cells 482. The second conductive layer 485 (or control gate) of the array portion is subsequently patterned to define the word lines of the memory device (not shown in FIG. 4G). Note that an isolation region 462 of the memory array portion isolates the tunnel dielectric layers and the floating gates of adjacent memory cells 482.

In the periphery, for one embodiment, the gate stacks form a part of logic devices 490, e.g., field-effect transistors. For example, these field-effect transistors can be part of row access circuitry 108 and/or column access circuitry 110 of the memory device 102 of FIG. 1 for accessing rows and columns of the memory array 104. The first dielectric layer 405 is a gate dielectric layer, and the first conductive layer 410 and the second conductive layer 485 are portions of a control gate of the logic devices 490. For some embodiments, the first conductive layer 410 and the second conductive layer 485 may be strapped (or shorted) together so that the shorted together first conductive layer 410 and second conductive layer 485 form the control gate of the respective logic devices 490. For another embodiment, the first conductive layer 410 and the second conductive layer 485 are not shorted together, and first conductive layer 410 forms the control gate of the respective logic devices 490.

For embodiments where protective cap layer 415 is formed directly on first dielectric layer 405, the structure of FIG. 4G is formed as follows: Protective cap layer 415 and first dielectric layer 405 are removed substantially concurrently or the protective cap layer 415 is removed followed by the removal of the first dielectric layer 405. A third dielectric layer 495 is then formed on substrate 400 in FIG. 4G. The third dielectric layer 495 may be substantially the same as the second dielectric layer 405 and acts as a tunnel dielectric layer in the array and a gate dielectric in the periphery. Subsequently, the first conductive layer 410, the second dielectric layer 480, and the second conductive layer 485 are formed overlying the third dielectric layer 495.

It is noted that FIGS. 4A-4G depict a portion of a row of memory cells running parallel to a face plane of the drawings. Columns of memory cells, separated by the isolation regions 462, run perpendicular to the drawings, with source and drain regions formed at opposing ends of the tunnel dielectric layer 405, one above the face plane of the figures and one below the face plane of the figures. It is noted that FIGS. 4A-4G can depict either a NOR-type memory device or a NAND-type memory device, with the differences occurring in the column direction in manners that are well understood in the art of memory fabrication.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of forming a memory device, comprising:
   forming a first dielectric layer on a semiconductor substrate;
   forming a protective cap layer overlying the first dielectric layer;
   forming and patterning a hard mask layer overlying the protective cap layer, the patterned hard mask layer exposing two or more areas of the protective cap layer, the first dielectric layer, and the substrate for future isolation regions of the memory device;
   removing portions of the protective cap layer, the first dielectric layer and the substrate in the areas for future isolation regions, thereby forming two or more trenches;
   forming a second mask layer overlying a first portion of the hard mask layer and at least one first trench in a memory array portion of the memory device, leaving a second portion of the hard mask layer and at least one second trench uncovered in a periphery of the memory device;
   removing additional substrate material from the at least one second trench so that the at least one second trench is deeper than the at least one first trench;
   removing the hard mask layer and the second mask layer substantially concurrently;
   filling the at least one first trench and the at least one second trench with a dielectric material to respectively form at least one first isolation region in the memory array portion and at least one second isolation region in the periphery;
   removing the protective cap layer;
   forming a second dielectric layer overlying the substrate and on the at least one first isolation region and the at least one second isolation region; and
   forming a first conductive layer overlying the second dielectric layer.

2. The method of claim 1 further comprises forming a second conductive layer overlying the first dielectric layer before forming the protective cap layer, wherein the protective cap layer overlies the second conductive layer.

3. The method of claim 2, wherein forming a second dielectric layer overlying the substrate further comprises forming the second dielectric layer overlying the second conductive layer.

4. The method of claim 1 further comprises removing the first dielectric layer substantially concurrently with removing the protective cap layer or after removing the protective cap layer, but before forming the second dielectric layer.

5. The method of claim 4 further comprises forming a third dielectric layer overlying the substrate after removing the first dielectric layer, but before forming the second dielectric layer.

6. The method of claim 5 further comprises forming a second conductive layer overlying the third dielectric layer, but before forming the second dielectric layer, wherein forming the second dielectric layer further comprises forming the second dielectric layer overlying the second conductive layer.

7. The method of claim 1 wherein the dielectric material is selected from the group consisting of oxides and spin-on-dielectric materials.

8. The method of claim 1, wherein patterning the hard mask layer comprises forming a third mask layer on the hard mask layer.

9. The method of claim 8, wherein the second mask layer is patterned without forming an additional mask layer thereon.

10. The method of claim 1, wherein removing the hard mask layer and the second mask layer substantially concurrently comprises using a photo-processing strip.

11. The method of claim 1, wherein the hard mask layer is a carbon layer.

12. The method of claim 1, wherein the second mask layer is a photo-resist mask layer.

13. The method of claim 1, wherein forming a first dielectric layer on a semiconductor substrate comprises blanket depositing or thermally growing the dielectric layer on the semiconductor substrate.

14. The method of claim 1, wherein the first dielectric layer is an oxide layer.

15. The method of claim 1, wherein the second dielectric layer is selected from the group consisting of one or more layers of dielectric material, an oxide-nitride-oxide dielectric material, tantalum oxide, barium strontium titanate, and silicon nitride.

16. The method of claim 1, wherein the first conductive layer is selected from the group consisting of a layer containing a conductively-doped polysilicon, a metal-containing layer overlying a polysilicon layer, a refractory metal silicide layer formed on a conductively-doped polysilicon layer, multiple metal-containing layers, and a layer including a barrier layer overlying the second dielectric layer, an adhesion layer overlying the barrier layer, and a metal layer overlying the adhesion layer.

17. A method of forming a memory device, comprising:
   forming a first dielectric layer on a semiconductor substrate;
   forming a first conductive layer on the dielectric layer;
   forming a protective cap layer on the conductive layer;
   forming a hard mask layer overlying the protective cap layer;
   forming a second mask layer overlying the hard mask layer for exposing two or more areas of the hard mask layer;
   removing the exposed two or more areas of the hard mask layer for exposing two or more areas of the protective cap layer, the conductive layer, the dielectric layer, and the substrate for future isolation regions of the memory device;
   removing the second mask layer;
   removing portions of the protective cap layer, the dielectric layer, the conductive layer, and the substrate in the areas for future isolation regions, thereby forming two or more trenches;
   forming a third mask layer overlying a first portion of the hard mask layer and at least one first trench in a memory array portion of the memory device, leaving a second portion of the hard mask layer and at least one second trench uncovered in a periphery of the memory device;
   removing additional substrate material from the at least one second trench so that the at least one second trench is deeper than the at least one first trench;
   stripping the hard mask layer and the third mask layer substantially concurrently;
   filling the at least one first trench and the at least one second trench with a dielectric material to respectively form at least one first isolation region in the memory array portion and at least one second isolation region in the periphery;
   removing the protective cap layer to expose the first conductive layer;
   forming a second dielectric layer on the first conductive layer and on the at least one first isolation region and the at least one second isolation region; and
   forming a second conductive layer on the second dielectric layer.

18. The method of claim 17, wherein the first dielectric layer, the first conductive layer, the second dielectric layer, and the second conductive layer in the memory array portion respectively form a tunnel dielectric layer, a floating gate, an intergate dielectric layer, and a control gate of one or more floating-gate memory cells adjacent the at least one first isolation region.

19. The method of claim 17, wherein the first dielectric layer, the first conductive layer, the second dielectric layer, and the second conductive layer in the periphery form one or more logic devices adjacent the at least one second isolation region.

20. A method of forming a memory device, comprising:
   forming a first dielectric layer on a semiconductor substrate;
   forming a first conductive layer on the dielectric layer;
   forming a protective cap layer on the conductive layer;
   forming a carbon mask layer overlying the protective cap layer;
   forming a first photo-resist mask layer overlying the carbon mask layer for exposing two or more areas of the carbon mask layer;
   removing the exposed two or more areas of the carbon mask layer for exposing two or more areas of the protective cap layer, the conductive layer, the dielectric layer, and the substrate for future isolation regions of the memory device;
   removing the first photo-resist mask layer;
   removing portions of the protective cap layer, the dielectric layer, the conductive layer, and the substrate in the areas for future isolation regions, thereby forming two or more trenches;
   forming a second photo-resist mask layer overlying a first portion of the carbon mask layer and at least one first trench in a memory array portion of the memory device, leaving a second portion of the carbon mask layer and at least one second trench uncovered in a periphery of the memory device;
   removing additional substrate material from the at least one second trench so that the at least one second trench is deeper than the at least one first trench;
   removing the carbon mask layer and the second photo-resist mask layer substantially concurrently;
   filling the at least one first trench and the at least one second trench with a dielectric material to respectively form at least one first isolation region in the memory array portion and at least one second isolation region in the periphery;
   removing the protective cap layer to expose the first conductive layer;
   forming a second dielectric layer on the first conductive layer and on the at least one first isolation region and the at least one second isolation region; and
   forming a second conductive layer on the second dielectric layer.

21. The method of claim 20 wherein the dielectric material is selected from the group consisting of oxides and spin-on-dielectric materials.

22. The method of claim 20, wherein removing the carbon mask layer and the second photo-resist mask layer substantially concurrently comprises a stripping operation.

23. The method of claim 20, wherein forming a first dielectric layer on a semiconductor substrate comprises blanket depositing or thermally growing the dielectric layer on the semiconductor substrate.

24. The method of claim 20, wherein the first dielectric layer is an oxide layer.

25. The method of claim 20, wherein the first conductive layer is selected from the group consisting of a polysilicon layer, doped or undoped silicon materials, monocrystalline silicon, nanocrystalline silicon, and amorphous silicon.

26. The method of claim 20, wherein the second dielectric layer is selected from the group consisting of one or more layers of dielectric material, an oxide-nitride-oxide dielectric material, tantalum oxide, barium strontium titanate, and silicon nitride.

27. The method of claim 20, wherein the second conductive layer is selected from the group consisting of a layer containing a conductively-doped polysilicon, a metal-containing layer overlying a polysilicon layer, a refractory metal silicide layer formed on a conductively-doped polysilicon layer, multiple metal-containing layers, and a layer including a barrier layer overlying the second dielectric layer, an adhesion layer overlying the barrier layer, and a metal layer overlying the adhesion layer.

* * * * *